United States Patent
Shibata et al.

(10) Patent No.: US 8,034,693 B2
(45) Date of Patent: Oct. 11, 2011

(54) METHOD FOR FABRICATING SEMICONDUCTOR DEVICE

(75) Inventors: Junichi Shibata, Hyogo (JP); Takeshi Harada, Shiga (JP); Akira Ueki, Osaka (JP)

(73) Assignee: Panasonic Corporation, Osaka (JP)

( * ) Notice: Subject to any disclaimer, the term of this patent is extended or adjusted under 35 U.S.C. 154(b) by 130 days.

(21) Appl. No.: 12/493,673

(22) Filed: Jun. 29, 2009

(65) Prior Publication Data
US 2009/0263951 A1     Oct. 22, 2009

Related U.S. Application Data

(63) Continuation of application No. PCT/JP2008/002979, filed on Oct. 21, 2008.

(30) Foreign Application Priority Data

Nov. 12, 2007   (JP) ................................. 2007-293136

(51) Int. Cl.
*H01L 21/678* (2006.01)
(52) U.S. Cl. ........ 438/422; 438/430; 438/637; 438/672; 257/522; 257/E21.585
(58) Field of Classification Search .................. 438/422, 438/637, 672, 430; 257/410, 522, E21.585, 257/E21.577, E21.597, E21.573
See application file for complete search history.

(56) References Cited

U.S. PATENT DOCUMENTS

| | | | |
|---|---|---|---|
| 6,162,723 | A | 12/2000 | Tanaka |
| 2001/0023128 | A1 | 9/2001 | Ueda et al. |
| 2002/0043673 | A1 | 4/2002 | Tamaoka et al. |
| 2003/0109127 | A1 | 6/2003 | Tamaoka et al. |
| 2004/0097065 | A1 | 5/2004 | Lur et al. |
| 2006/0088975 | A1* | 4/2006 | Ueda .............................. 438/421 |
| 2006/0281298 | A1 | 12/2006 | Noguchi et al. |

FOREIGN PATENT DOCUMENTS

| | | |
|---|---|---|
| JP | 10-012730 | 1/1998 |
| JP | 2004-241635 | 8/2004 |
| JP | 2006-120988 | 5/2006 |
| JP | 2007-188919 | 7/2007 |

* cited by examiner

*Primary Examiner* — Thinh T Nguyen
(74) *Attorney, Agent, or Firm* — McDermott Will & Emery LLP

(57) ABSTRACT

A method for fabricating a semiconductor device includes the steps of forming an insulating film on a semiconductor substrate, forming a plurality of wiring trenches in the insulating film, forming a plurality of wirings in the plurality of wiring trenches, forming a resist mask having an opening for selectively exposing one of regions between the plurality of wirings, on the insulating film and the plurality of wirings, forming an air gap trench by removing the insulating film from the selectively exposed one of the regions between the plurality of wirings by etching using the resist mask, and forming an air gap in the air gap trench by depositing an inter-layer insulating film over the plurality of wirings after removal of the resist mask.

21 Claims, 13 Drawing Sheets

(a)

(b)

(c)

METHOD FOR FABRICATING SEMICONDUCTOR DEVICE

This application is a continuation of International Application No. PCT/JP2008/002979, whose international filing date is Oct. 21, 2008 which in turn claims the benefit of Japanese Patent Application No. 2007-293136, filed on Nov. 12, 2007, the disclosures of which Applications are incorporated by reference herein. The benefit of the filing and priority dates of the International and Japanese Applications is respectfully requested.

TECHNICAL FIELD

The present invention relates to a method for fabricating a semiconductor device, and more particularly, to a method for fabricating a multilayer wiring structure.

BACKGROUND ART

In recent years, as semiconductor integrated circuit devices have been miniaturized, a gap between wirings connecting devices or elements in a device has also been reduced. Therefore, a capacitance between wirings increases, leading to a decrease in signal propagation speed, which problem has come to the surface. Therefore, for example, a method of forming an air gap between wirings so as to reduce the capacitance has been proposed as described in Patent Document 1.

Hereinafter, a conventional method for fabricating a semiconductor device described in Patent Document 1 will be described with reference to the accompanying drawings.

FIGS. 18(a) to (d) and FIGS. 19(a) to (c) are cross-sectional views showing the conventional semiconductor device fabricating method in order in which the device is fabricated.

Initially, as shown in FIG. 18(a), a first insulating film 10 is deposited on a semiconductor substrate (not shown) on which a semiconductor active element is provided, and thereafter, recesses are formed in the first insulating film 10. Next, a first barrier metal film 11 is formed on bottom portions and wall portions of the recesses in the first insulating film 10, and thereafter, the recesses are filled with a copper film to form first wirings 12.

Next, as shown in FIG. 18(b), a liner insulating film 13 is deposited on the first insulating film 10 and the first wirings 12 so as to prevent the first wirings 12 from peeling off and prevent copper included in the first wirings 12 from diffusing.

Next, as shown in FIG. 18(c), a resist pattern 14 is formed on the liner insulating film 13 by lithography. The resist pattern 14 has an opening pattern 14a which allows removal of only portions between desired first wirings 12 in the first insulating film 10, and is used so as to form inter-wiring gaps between the desired first wirings 12. In other words, the resist pattern 14 is a mask pattern which exposes only regions between the desired first wirings 12.

Next, as shown in FIG. 18(d), the liner insulating film 13 and the first insulating film 10 are subjected to dry etching using the resist pattern 14 as a mask, to form inter-wiring gaps 15 between the first wirings 12.

Next, as shown in FIG. 19(a), a second insulating film 17 is deposited on the inter-wiring gaps 15 between the first wirings 12 and the liner insulating film 13 to form air gaps 16 between the first wirings 12. A top portion of each air gap 16 protrudes above the liner insulating film 13. If a film which has a low coverage rate and poor filling performance is used as the second insulating film 17, the air gaps 16 can be easily formed.

Next, as shown in FIG. 19(b), a connection hole 17a which exposes a surface of a first wiring 12 is formed in the second insulating film 17 by etching, and thereafter, wiring trenches 17b are formed. In this case, Dual Damascene is employed in which the connection hole 17a is formed prior to the wiring trenches 17b.

Next, as shown in FIG. 19(c), a barrier metal film is formed on the second insulating film 17 including the connection hole 17a and the wiring trenches 17b, and thereafter, a plating film is formed using a seed film. Thereafter, excess portions of the barrier metal film, the seed film and the plating film extending off the insides of the connection hole 17a and the wiring trenches 17b are removed by metal CMP. As a result, a barrier metal film 18 and a via hole 19 are formed in the connection hole 17a, and a barrier metal film 20 and a second wiring 21 are formed in each wiring trench 17b. Thus, a double-layer wiring including the first wirings 12 and the second wirings 21 is formed.

Thus, a semiconductor device having a multilayer wiring, in which the air gap 16 is formed between the first wirings 12 made of a copper film, can be fabricated. The relative dielectric constant of the air gap 16 made of air is about ¼ of that of the first insulating film 10. Therefore, by providing the air gap 16, a capacitance between adjacent first wirings 12 can be reduced. Therefore, a signal delay between adjacent first wirings 12 can be suppressed, whereby a semiconductor device which has a large margin of operation and is less likely to malfunction can be achieved. Moreover, a conventional material for wirings can be utilized, leading to lower cost.

Patent Document 1: Japanese Unexamined Patent Application Publication No. 2006-120988

DISCLOSURE OF THE INVENTION

Problems to be Solved by the Invention

However, according to the aforementioned conventional semiconductor device fabricating method, an air gap is formed in an entire region of a specific inter-wiring space. Therefore, the mechanical strength of a wiring is reduced, so that the wiring peels off a wiring interface during formation of the wiring, and the wiring layer collapses due to pressure from an upper layer during wire bonding, resulting in a reduction in yield of the semiconductor device.

In view of the description above, an object of the present invention is to provide a semiconductor device which has a high yield and has a structure in which a capacitance between wirings can be sufficiently reduced, and a method for fabricating the semiconductor device.

Solution to the Problems

To achieve the object, a method according to an embodiment of the present invention is provided for fabricating a semiconductor device including a multilayer wiring structure including a plurality of wiring layers having an air gap between wirings. The method includes the steps of forming an insulating film on a semiconductor substrate, forming a plurality of wiring trenches in the insulating film, forming a plurality of the wirings in the plurality of wiring trenches, forming a resist mask having an opening for selectively exposing one of regions between the plurality of wirings, on the insulating film and the plurality of wirings, forming an air gap trench by removing the insulating film from the selectively exposed one of the regions between the plurality of wirings by etching using the resist mask, and forming the air gap in the air gap trench by depositing an inter-layer insulating film over the plurality of wirings after removal of the resist mask.

In the semiconductor device fabricating method of the embodiment of the present invention, the opening of the resist mask is formed based on a proportion of an area of the opening in a desired region of a single one of the wiring layers.

In the semiconductor device fabricating method of the embodiment of the present invention, the opening of the resist mask is formed based on an average of proportions of areas of the openings in desired regions of respective wiring layers in which the air gap is formed of the plurality of wiring layers.

In the semiconductor device fabricating method of the embodiment of the present invention, the air gap is formed only in at least one wiring layer having a relatively thin film thickness of the plurality of wiring layers.

In the semiconductor device fabricating method of the embodiment of the present invention, when the plurality of wirings in the wiring layer include a wiring used as a signal line and a dummy wiring, the opening of the resist mask is formed in a manner which prevents a region in which the dummy wiring is formed and which is located at a distance of 1 μm or more from the wiring used as a signal line, from being exposed.

In the semiconductor device fabricating method of the embodiment of the present invention, at least a chip region, and a pattern region for managing a line width of a scribe line region for cutting the chip region, are subjected to etching using the resist mask.

In the semiconductor device fabricating method of the embodiment of the present invention, in a structure in which the wiring layer as an upper layer is formed on the wiring layer as a lower layer in which the air gap is formed, the opening of the resist for use in forming the upper wiring layer is formed in a manner which prevents a region immediately above the air gap of the lower wiring layer, from being exposed.

In the semiconductor device fabricating method of the embodiment of the present invention, in a structure in which the wiring layer as an upper layer is formed on the wiring layer as a lower layer having a first region larger than a smallest inter-wiring space between the wirings, the opening of the resist for use in forming the upper wiring layer is formed in a manner which prevents a second region immediately above the air gap having a width corresponding to the first region, the air gap being formed in the lower wiring layer, from being exposed.

In the semiconductor device fabricating method of the embodiment of the present invention, in a structure in which the wiring layer as an upper layer is formed on the wiring layer as a lower layer having a first region larger than a smallest inter-wiring space between the wirings, the opening of the resist for use in forming the lower wiring layer is formed in a manner which allows a second region narrower than the first region to be exposed.

In the semiconductor device fabricating method of the embodiment of the present invention, in a structure in which the wiring layer as an upper layer is formed on the wiring layer as a lower layer having a first region larger than a smallest inter-wiring space between the wirings, the opening of the resist for use in forming the lower wiring layer is formed in a manner which allows the smallest inter-wiring space to be periodically exposed.

In the semiconductor device fabricating method of the embodiment of the present invention, in the forming the air gap trench, the opening of the resist mask is formed in a manner which prevents a portion forming the insulating film to be isolated in the air gap trench.

In the semiconductor device fabricating method of the embodiment of the present invention, in the forming the air gap trench, the opening of the resist mask is formed in a manner which provides a first portion forming the insulating film isolated in the air gap trench and a second portion where the first portion is joined with a region in which the air gap is not formed.

In the semiconductor device fabricating method of the embodiment of the present invention, in the forming the air gap trench, when a length between the wirings of the formed air gap trench is five times or more as large as a smallest inter-wiring space between the wirings, the joined portion is formed at at least one place.

In the semiconductor device fabricating method of the embodiment of the present invention, in the forming the air gap trench, the opening of the resist mask is formed in a manner which prevents a portion forming the wiring from being isolated in the air gap trench.

In the semiconductor device fabricating method of the embodiment of the present invention, in the forming the air gap trench, the opening of the resist mask is formed in a manner which provides a first portion forming the wiring formed and isolated in the air gap trench, and a second portion where the first portion is joined with a region where the air gap is not formed.

In the semiconductor device fabricating method of the embodiment of the present invention, in the forming the air gap trench, when a length between the wirings of the formed air gap trench is five times or more as large as a smallest inter-wiring space between the wirings, the joined portion is formed at at least one place.

In the semiconductor device fabricating method of the embodiment of the present invention, the opening of the resist mask is formed in a manner which prevents a region immediately below a region where a bonding pad is provided, from being exposed.

In the semiconductor device fabricating method of the embodiment of the present invention, the opening of the resist mask is formed based on an average of proportions of areas of the openings in desired regions of respective wiring layers in which the air gap is formed of the plurality of wiring layers, in a region of an active region immediately below a region where a bonding pad is provided.

In the semiconductor device fabricating method of the embodiment of the present invention, the opening of the resist mask is formed in a manner which prevents a region with sides of 20 μm at a corner portion of a chip, from being exposed.

In the semiconductor device fabricating method of the embodiment of the present invention, the opening of the resist mask is formed in a manner which allows a peripheral region including a wiring connected to a diffusion layer of the plurality of wirings to be exposed.

In the semiconductor device fabricating method of the embodiment of the present invention, the opening of the resist mask is formed in a manner which prevents a region where an IO portion is to be formed, from being exposed.

In the semiconductor device fabricating method of the embodiment of the present invention, the opening of the resist mask is formed in a manner which allows a region including a bit line and a word line of a memory portion to be exposed.

In the semiconductor device fabricating method of the embodiment of the present invention, the opening of the resist mask is formed in a manner which prevents a region where a capacitor portion is to be formed, from being exposed.

In the semiconductor device fabricating method of the embodiment of the present invention, the opening of the resist mask is formed in a manner which prevents a photodetector of a CCD and a region surrounding the photodetector, the region being located at a distance of 5 μm or less from the photodetector, from being exposed.

In the semiconductor device fabricating method of the embodiment of the present invention, the opening of the resist mask is formed in a manner which prevents a region where an analog circuit portion is to be formed, from being exposed.

In the semiconductor device fabricating method of the embodiment of the present invention, the opening of the resist mask is formed in a manner which allows a region where a wiring fuse portion is to be formed to be exposed.

In the semiconductor device fabricating method of the embodiment of the present invention, when a via hole is provided between two of the plurality of wiring layers, the via hole connecting a wiring in the upper one of the two wiring layers and a wiring in the lower one of the two wiring layers, the opening of the resist mask is formed in a manner which prevents a region around the wiring in the upper wiring layer connected to the via hole, from being exposed.

In the semiconductor device fabricating method of the embodiment of the present invention, the opening of the resist mask is formed in a manner which prevents a region where spaces between the wirings meet from three or more directions, from being exposed.

Effect of the Invention

As described above, according to the semiconductor device fabricating method according to the embodiment of the present invention, a resist mask is provided with a characteristic shape which limits a region where an air gap is to be formed to a desired region. As a result, an inter-wiring capacitance can be reduced and a sufficient mechanical strength of a wiring can be obtained.

Figure 1:
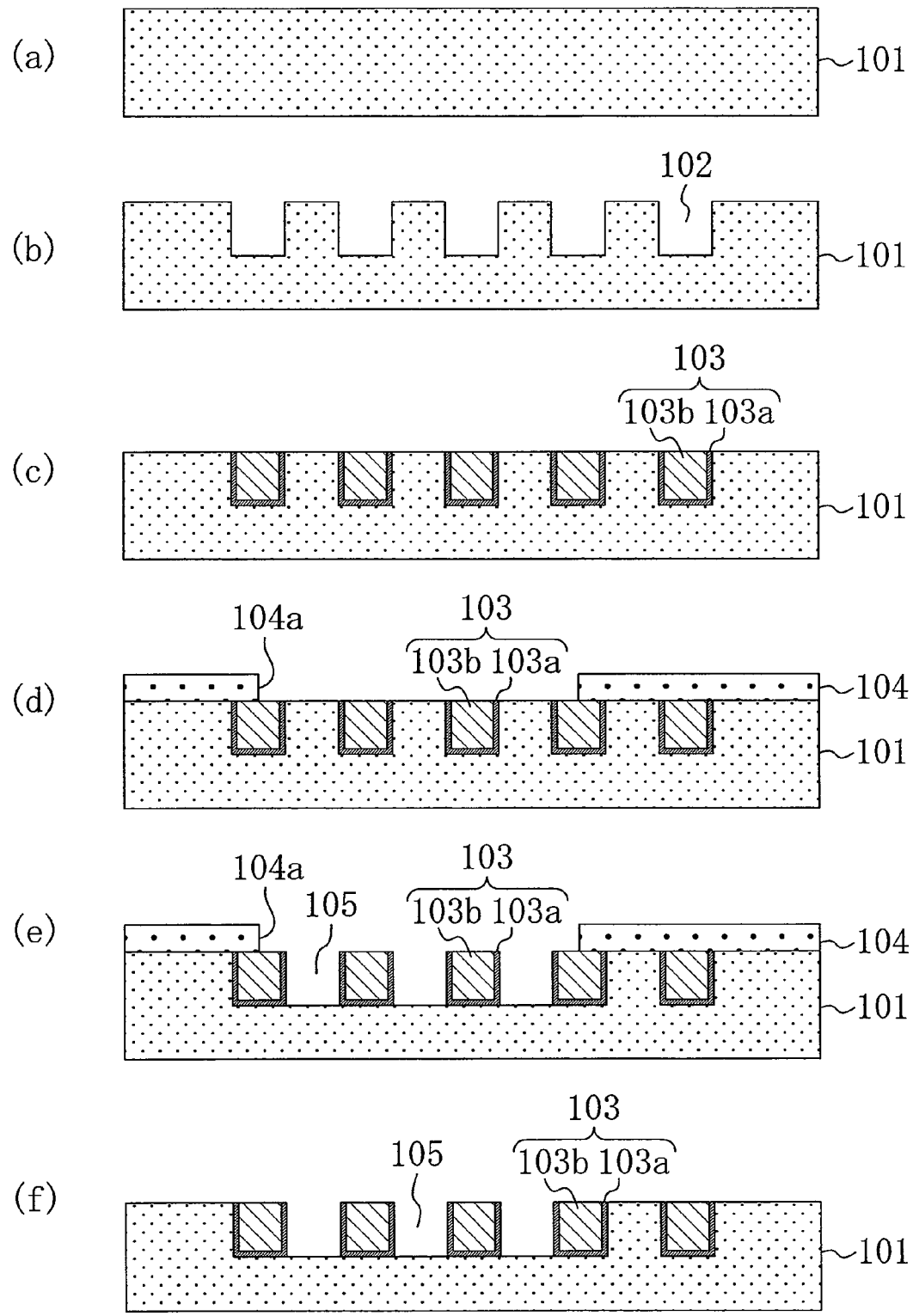
FIGS. 1(a) to 1(f) are cross-sectional views showing a method for fabricating a semiconductor device according to an embodiment of the present invention in order in which the device is fabricated.

DESCRIPTION OF THE REFERENCE CHARACTERS 101 insulating film
102 wiring trench
103a barrier film
103b copper film
103 wiring
104 resist mask
104a opening
105 air gap trench
106 inter-layer insulating film
107, 107a, 107b air gap
108 resist mask
108a opening
109 via hole
110 resist mask
110a opening
111 wiring trench
112a barrier film
112b copper film
112 wiring
113a barrier film
113b copper film
113 wiring connected to via hole
114 resist mask
114a opening
115 air gap trench
116 inter-layer insulating film
117 air gap
122 dummy pattern
201 inter-layer insulating film
202 via hole 203 wiring
204 air gap
300 chip
301 bonding pad
400 semiconductor wafer
4A, 5A, 5B, 8A, 11A region
13A corner portion of chip
14A photodetector portion of CCD
15A peripheral region of fuse portion
16A upper peripheral region of via hole

BEST MODE FOR CARRYING OUT THE
INVENTION

Hereinafter, a semiconductor device according to an embodiment of the present invention and a fabrication method thereof will be described with reference to the drawings. Note that the present invention is not limited to the embodiment below, and various changes and modifications could be made without departing the spirit and scope of the present invention.

—Method for Fabricating Semiconductor Device—

FIGS. 1(a) to (f), 2(a) to (d) and 3(a) to (d) are cross-sectional views showing the fabrication method of the semiconductor device of the embodiment of the present invention in order in which the device is fabricated.

Initially, as shown in FIG. 1(a), an insulating film 101 is formed on a semiconductor substrate (not shown) in which a semiconductor active element is provided.

Next, as shown in FIG. 1(b), wiring trenches 102 are formed in the insulating film 101 by photolithography and dry etching.

Next, as shown in FIG. 1(c), a barrier metal film is deposited on bottom portions and wall portions of the wiring trenches 102 in the insulating film 101, and the insulating film 101, and thereafter, a copper film is deposited to fill the wiring trenches 102. Thereafter, portions of the barrier metal film and the copper film extending off the insides of the wiring trenches 102 are removed by polishing (CMP (chemical mechanical polishing)), to form wirings 103 made of a barrier metal film 103a and a copper film 103b in the wiring trenches 102.

Next, as shown in FIG. 1(d), a resist mask 104 having an opening 104a which exposes a desired region (regions on the insulating film 101 and the wiring 103 are selectively exposed) is formed on the insulating film 101 and the wirings 103. Note that the resist mask 104 may take various shapes, which will be described below.

Next, as shown in FIG. 1(e), air gap trenches 105 are formed in regions between the wirings 103 by dry etching using the resist mask 104 as a mask.

Next, as shown in FIG. 1(f), the resist mask 104 is removed by ashing and washing.

Figure 2:
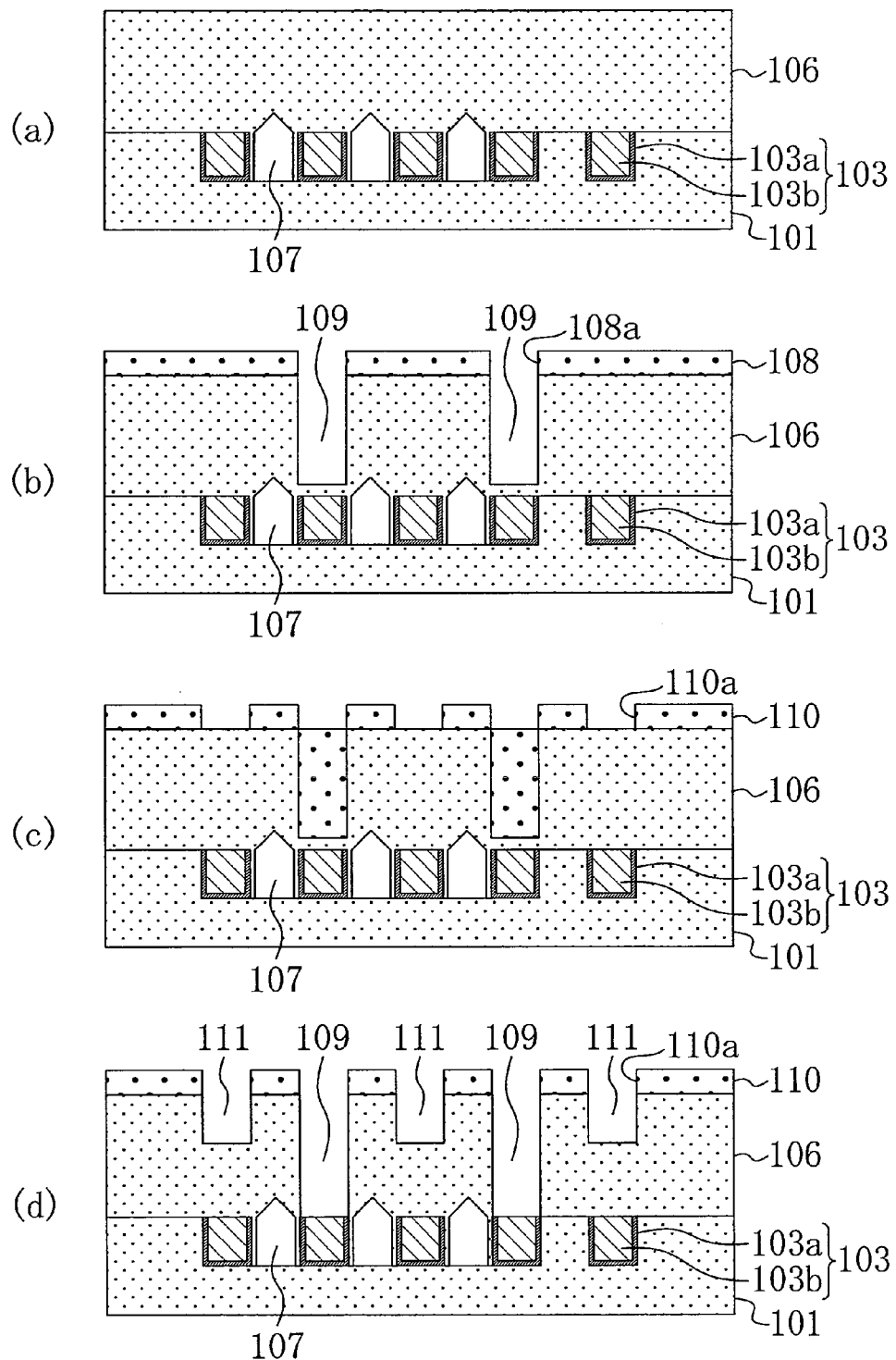
FIGS. 2(a) to 2(d) are cross-sectional views showing the semiconductor device fabricating method of the embodiment of the present invention in order in which the device is fabricated.

Next, as shown in FIG. 2(a), an inter-layer insulating film 106 having poor coverage capability is deposited, whereby air gaps 107 whose top portions protrude above the insulating film 101 are formed. Note that, in this case, the air gaps 107 are formed only in a region which is exposed by the opening 104a of the resist mask 104.

Next, as shown in FIG. 2(b), a resist mask 108 having openings 108a which expose desired regions in which via holes are to be formed is formed on the inter-layer insulating film 106, and thereafter, via holes 109 are formed in the inter-layer insulating film 106 by dry etching using the resist mask 108.

Next, as shown in FIG. 2(c), a resist mask 110 having openings 110a which expose desired regions in which wirings are to be formed is formed on the inter-layer insulating film 106.

Next, as shown in FIG. 2(d), wiring trenches 111 are formed in the inter-layer insulating film 106 by dry etching using the resist mask 110.

Figure 3:
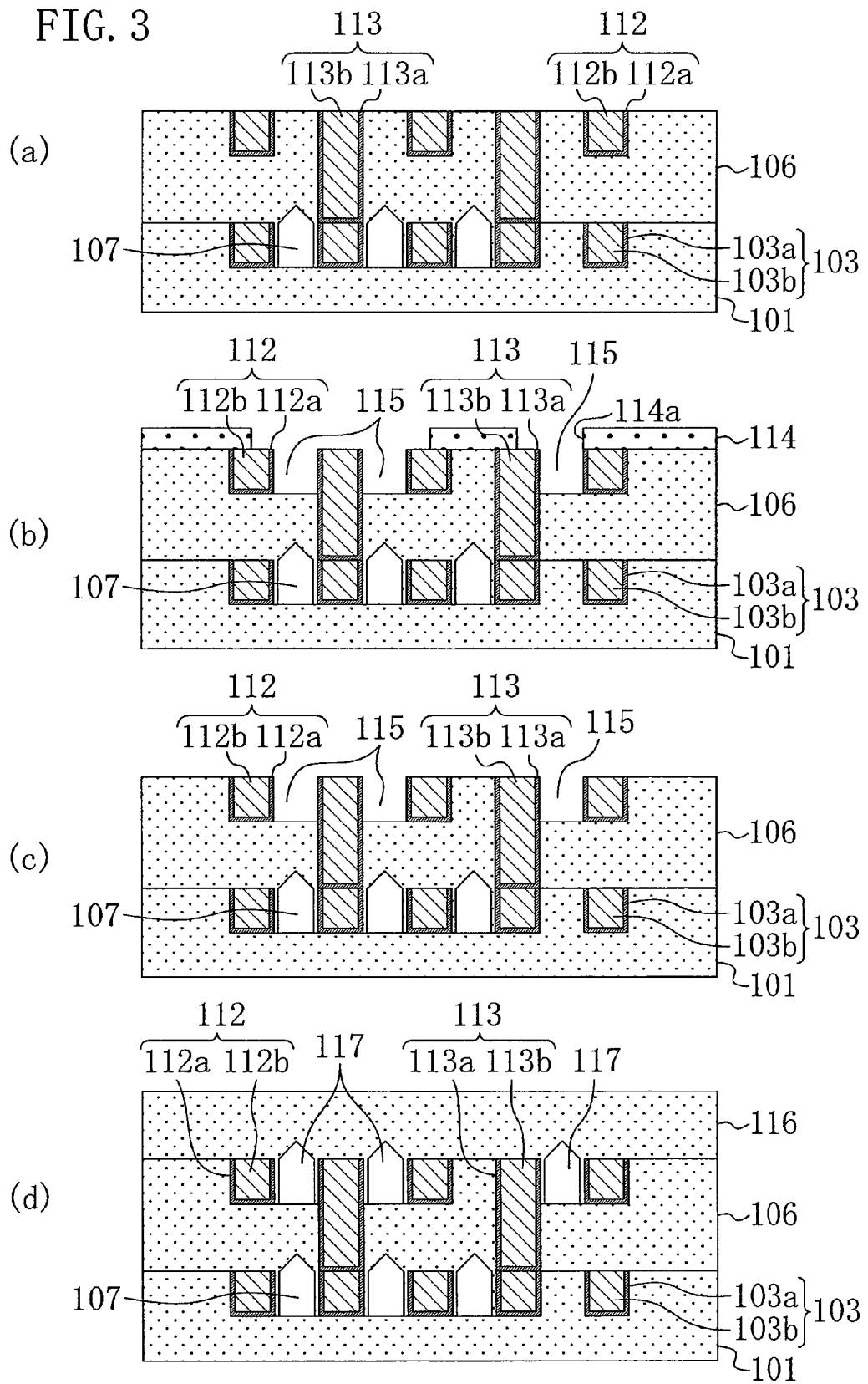
FIGS. 3(a) to 3(d) are cross-sectional views showing the semiconductor device fabricating method of the embodiment of the present invention in order in which the device is fabricated.

Next, as shown in FIG. 3(a), a barrier metal film is deposited on bottom portions and wall portions of the via holes 109 and the wiring trenches 111 in the inter-layer insulating film 106, and also on the inter-layer insulating film 106, and thereafter, a copper film is deposited to fill the via holes 109 and the wiring trenches 111. Thereafter, portions of the barrier metal film and the copper film which extend off the insides of the via holes 109 and the wiring trenches 111 are removed by polishing (CMP) to form wirings 112 made of a barrier metal film 112a and a copper film 112b in the wiring trenches 111, and via holes 113 made of a barrier metal film 113a and a copper film 113b in the via holes 109. Thus, multilayer wirings are formed.

Next, as shown in FIG. 3(b), a resist mask 114 having openings 114a which expose desired regions (i.e., selectively expose regions on the inter-layer insulating film 106, the wiring 112 and the via hole 113) is formed on the inter-layer insulating film 106, the wiring 112 and the via hole 113. Note that the resist mask 114 may take various shapes, which will be described below. Thereafter, air gap trenches 115 are formed in desired regions between the wirings 112 by dry etching using the resist mask 114 as a mask.

Next, as shown in FIG. 3(c), the resist mask 114 is removed by ashing and washing.

Next, as shown in FIG. 3(d), an inter-layer insulating film 116 having poor coverage capability is deposited, whereby air gaps 117 whose top portions protrude above the inter-layer insulating film 106 are formed. Note that, in this case, the air gaps 117 are formed only in the regions which are exposed by the openings 114a of the resist mask 114.

Thereafter, the aforementioned steps of FIGS. 2(b) to (d) are repeatedly performed, thereby making it possible to form a multilayer wiring structure having any arbitrary number of layers.

Note that when the air gap trenches 105 and 115 are formed, etching is preferably performed in two separate steps. This is because if first etching is highly anisotropic etching and second etching is highly isotropic etching, the insulating film in the vicinity of the sidewalls of the wirings can be sufficiently removed, whereby a capacitance between the wirings can be sufficiently reduced.

Hereinafter, preferable embodiments of the resist masks 104 and 114 will be specifically described.

—Limitation on Area Ratio for Single Layer—

An opening area of the opening 104a of the resist mask 104 and an opening area of the openings 114a of the resist mask 114 are preferably limited to area ratios which are 30% or less of desired test regions of the respective corresponding layers. Note that the desired test region in this case is a square region with sides of 50 μm in each layer.

This is because if the opening area is larger than 30% of the whole area, the adhesiveness between adjacent (lower and upper) wiring layers at their interface is low, and therefore, interface delamination occurs with respect to the interface during the CMP process when the upper wiring layer is formed. Therefore, by setting the opening area to 30% or less of the whole area, the interface delamination can be suppressed.

—Limitation on Area Ratio for Multiple Layers—

A multilayer average area ratio of the lower resist mask 104 and the upper resist mask 114 (=Σ(the opening ratio of each wiring layer having air gaps)/the number of the wiring layers having air gaps) is preferably 25% or less. Note that the area ratio in this case is preferably calculated for each desired test region which is in the shape of a square with sides of 50 μm.

Figure 4:
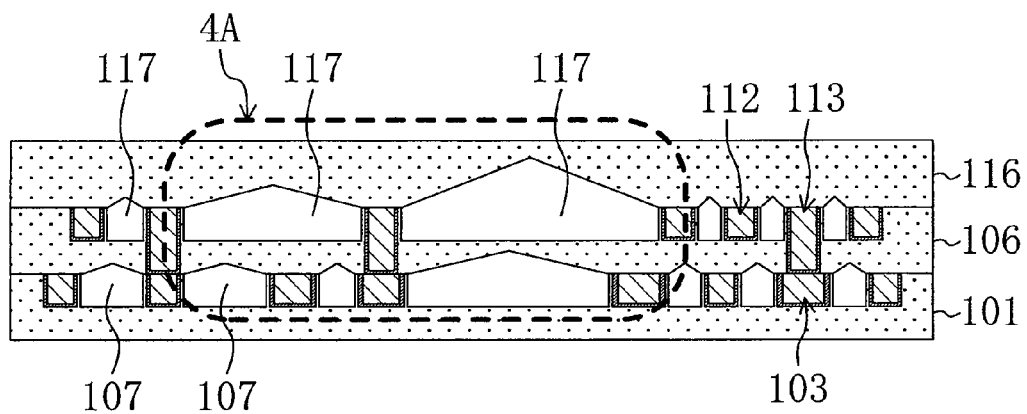
FIG. 4 is a diagram for describing a limitation on an area ratio of air gaps of multiple layers in the embodiment of the present invention.

This is because if, for example, as shown in FIG. 4, an overlapping portion of a region exposed by the opening 104a of the resist mask 104 and a region exposed by the opening 114a of the resist mask 114 is large, a region 4A occurs in which a volume ratio of the air gaps 107 and 117 locally becomes large, so that mechanical strengths of the wiring layers become low. Therefore, by setting the multilayer average area ratio of the resist masks 104 and 114 to 25% or less when the air gaps 107 and 117 are formed in the respective wiring layers, a decrease in mechanical strength can be prevented.

—Formation of Air Gaps in Multiple Layers—

The air gaps 107 and 117 are preferably formed only in fine layers having a relatively small film thickness of all wiring layers in a semiconductor device. In other words, the resist masks 104 and 114 are used only for the fine layers.

Figure 5:
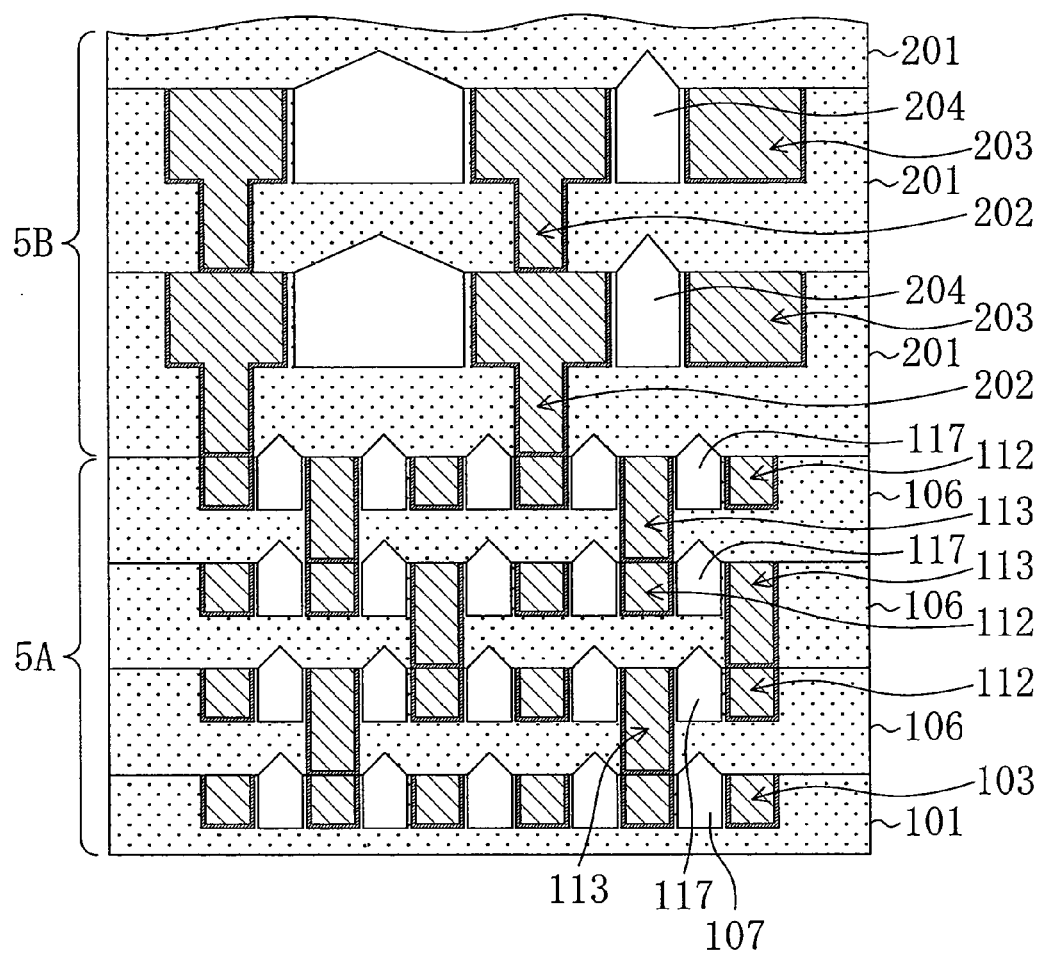
FIG. 5 is a diagram for describing formation of air gaps in layers in the embodiment of the present invention.
Figure 6:
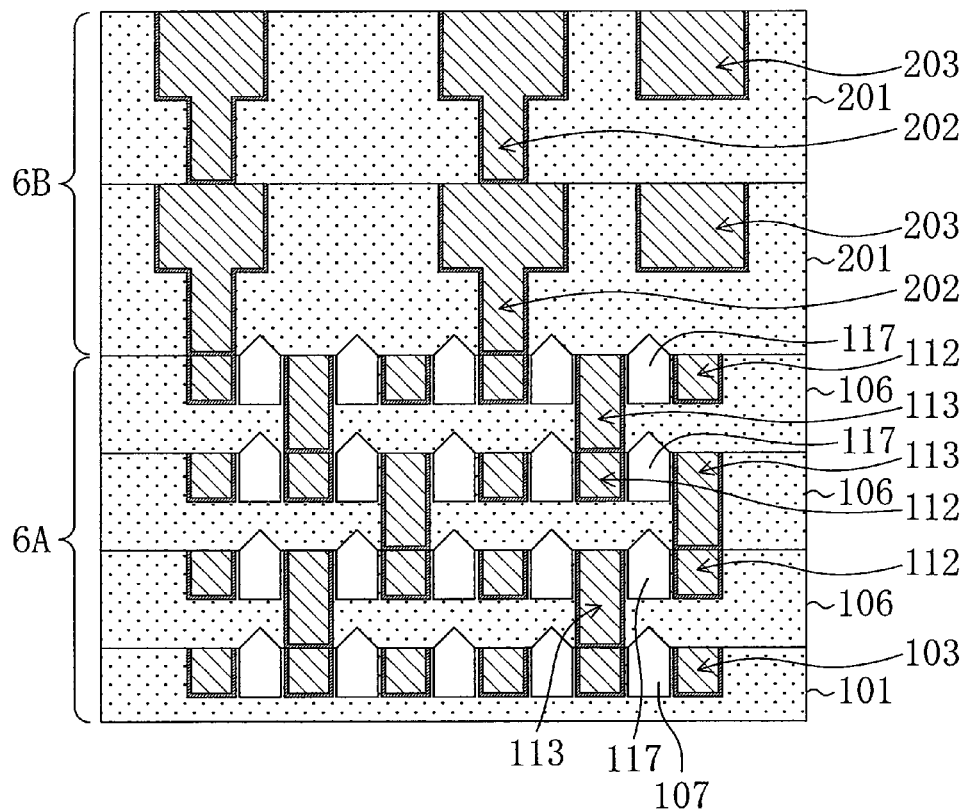
FIG. 6 is a diagram for describing formation of air gaps in layers in the embodiment of the present invention.

This is because if, for example, as shown in FIG. 5, a semiconductor device includes a region 5A formed of fine layers having a structure similar to that of FIG. 3(d) and having a relatively small film thickness, and a region 5B formed of inter-layer insulating films 201 having a structure similar to that of FIG. 3(d) and having a relatively large film thickness, in which via holes 202 and wirings 203 are formed, then when the resist masks 104 and 114 are applied to respective corresponding wiring layers of the regions 5A and 5B to form air gaps 204, a mechanical strength of the whole semiconductor device becomes low. Therefore, for example, as shown in FIG. 6, if a semiconductor device includes regions 6A and 6B as in FIG. 5, when only air gaps 107 and 117 are formed only in the region 6A formed of fine layers having a relatively small film thickness by applying the resist masks 104 and 114 thereto, a high mechanical strength of the semiconductor device can be obtained.

—Formation of Air Gaps in Dummy Pattern Formation Region—

The air gaps 107 and 117 are preferably not formed between dummy patterns.

Figure 7:
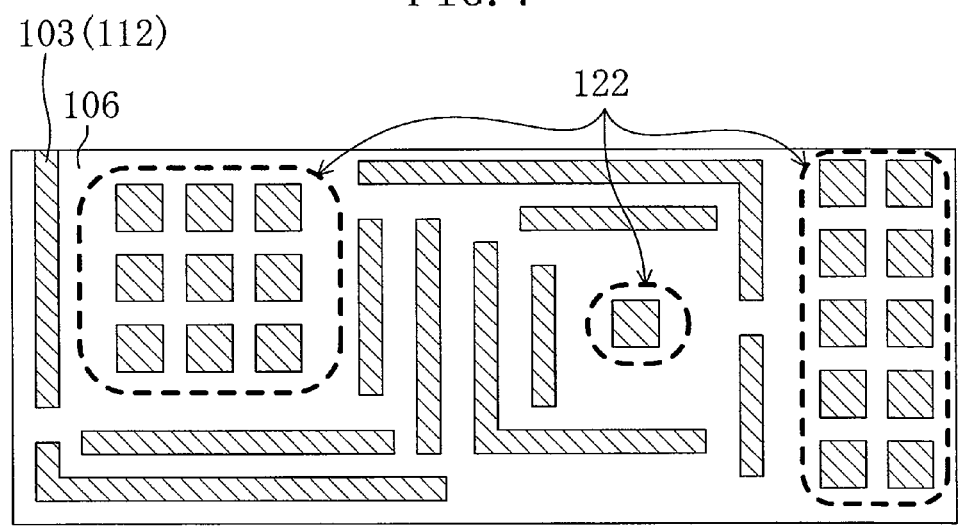
FIG. 7 is a diagram for describing formation of air gaps in a dummy pattern formation region in the embodiment of the present invention.

Specifically, when the wirings 103 and 112 include a dummy pattern which is a dot-like pattern provided so as to adjust the area ratio of the wirings in the semiconductor device, the air gaps 107 and 117 are preferably formed in dummy pattern formation regions 122 in which the dummy pattern is formed, using resist masks 104 and 114 having openings 104a and 114a which do not expose the regions 122, for example, as shown in FIG. 7.

In this case, the air gaps 107 and 117 are formed in the wiring formation region without being formed in the dummy pattern formation regions 122. Therefore, a high mechanical strength can be obtained without a decrease in operating speed of a semiconductor device. Note that the air gaps 107 and 117 are preferably not formed in portions of the dummy pattern formation regions 122 which are located at a distance of, for example, 1 μm or more from the wirings 103 and 112. This is because, while a capacitance can be reduced by the air gaps 107 and 117, a sufficient mechanical strength is obtained by avoiding formation of the air gaps 107 and 117 in the regions located at a distance of 1 μm or more.

—Formation of Air Gaps in Scribe Region—

The air gaps 107 and 117 are preferably formed only in a dimension management pattern and an initial electrical characteristic evaluation pattern which are provided in a scribe region.

This is because, for example, when the air gaps 107 and 117 are formed in the entire scribe region, a mechanical strength in the vicinity of a semiconductor chip significantly decreases, highly likely leading to occurrence of a crack into the semiconductor chip. Therefore, if the air gaps 107 and 117 are formed using resist masks 104 and 114 having openings 104a and 114a which expose only the dimension management pattern and the initial electrical characteristic evaluation pattern in the scribe region, a mechanical strength in the scribe region is significantly improved, whereby the occurrence of a crack into the chip can be prevented.

—Formation of Air Gaps in Upper Layer—

When the air gaps 107 and 117 are formed, it is preferable to use resist masks 104 and 114 having openings 104a and 114a which are formed in a manner which prevent regions of wiring layers immediately above the underlying air gaps 107 and 117 from being exposed.

This is because if regions exposed by openings 104a and 114a of resist masks 104 and 114 are provided immediately above regions exposed by openings 104a and 114a of resist masks 104 and 114, air gaps 107 and 117 formed in the upper wiring layer overlap air gaps 107 and 117 formed in the lower wiring layer, resulting in a local decrease in mechanical strength. In other words, in this case, the air gaps 107 and 117 may collapse at a portion where a local decrease in mechanical strength occurs as described above, due to a step (e.g., CMP, etc.) of the semiconductor device fabricating process in which pressure is applied to the portion from a wafer surface, which makes it difficult to form multilayer wiring. Therefore, by forming air gaps 107 and 117 in an upper and lower wiring layers in a manner which prevents them from overlapping, a local decrease in mechanical strength can be prevented, whereby the air gaps 107 and 117 can be prevented from collapsing.

—Formation of Air Gaps When Inter-Wiring Space is Large (1)—

When there is a wiring layer having an inter-wiring space which is larger than a smallest inter-wiring space of all wiring layers in a semiconductor device, the air gaps 107 and 117 are preferably not formed in a region of an upper wiring layer above that wiring layer, the region being located above the air gaps 107 and 117 formed in the wider inter-wiring space in the underlying layer (at least regions above the coordinate points of top portions of the air gaps 107 and 117).

This is because if, for example, as shown in FIG. 8(a), an air gap 117 is formed using a resist mask 114 having an opening 114a which exposes an upper portion of an air gap 107 formed in a region having a wide inter-wiring space, a portion of the air gap 107 is joined with a portion of an air gap trench 115 forming the air gap 117 in a region 8A, and therefore, when a treatment step using a chemical solution, such as washing or the like, is performed, the chemical solution enters the air gap 107, resulting in corrosion of a metal of the wiring 103. Therefore, when there is a wiring layer having an air gap in a region having an inter-wiring space which is larger than a smallest inter-wiring space of all wiring layers, then if it is forbidden to form an air gap in an upper wiring layer above that wiring layer and on the same coordinate axis as that of a top portion of that air gap, it is possible to prevent an air gap in the lower layer from being joined with an air gap trench in the upper layer.

—Formation of Air Gaps When Inter-Wiring Space is Large (2)—

When there is a wiring layer having an inter-wiring space which is larger than a smallest inter-wiring space of all wiring layers in a semiconductor device, an air gap (e.g., 107*a*) smaller than the large inter-wiring space is preferably formed without forming air gaps 107, 117 corresponding to the large inter-wiring space in the large inter-wiring space.

Figure 8:
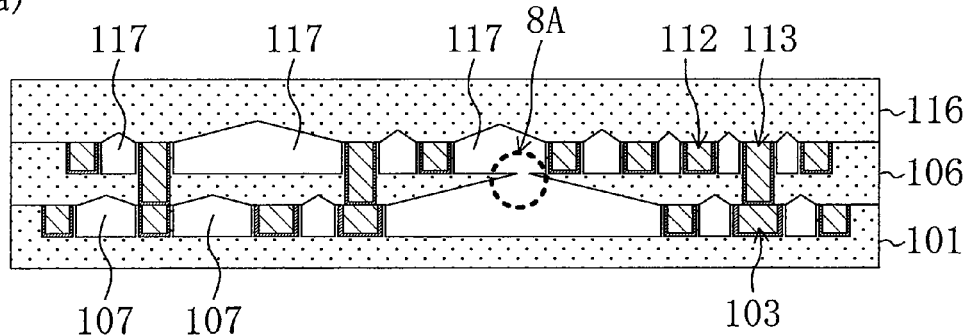
FIGS. 8(a) to 8(c) are diagrams for describing formation of air gaps when an inter-wiring space is large in the embodiment of the present invention.
Figure 8:
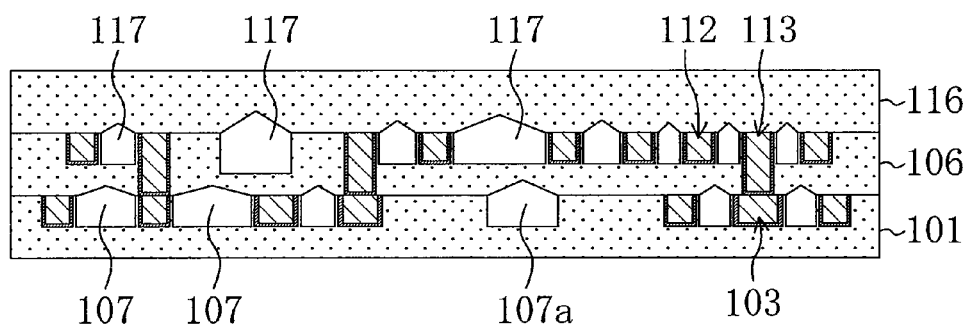
Figure 8:
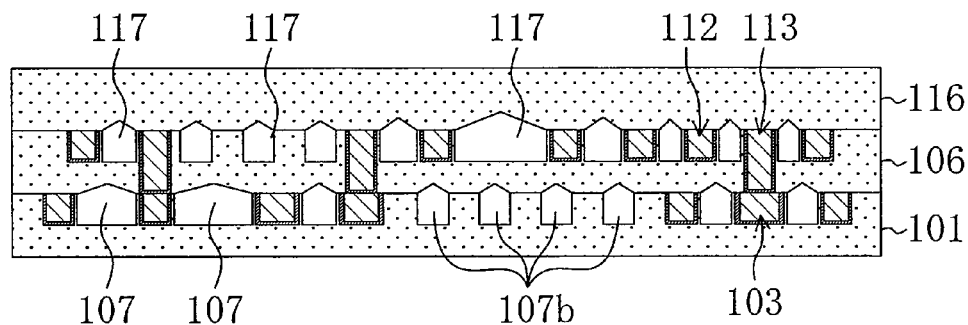

This is because, as described in (1) above, there is a possibility that a portion of an air gap 107 is joined with a portion of an air gap trench 115 as shown in FIG. 8(*a*), and moreover, there is a possibility that the proportions of the air gaps 107 and 117 locally increase, and therefore, the interface adhesiveness of the wiring 103 and the inter-layer insulating film 106 decreases, so that interface delamination occurs. Therefore, a structure can be contemplated in which, as described in (1) above, air gaps 107, 117 are not formed in an upper wiring layer above air gaps 107, 117 formed corresponding to the large inter-wiring space in a lower wiring layer. However, here, as shown in FIG. 8(*b*), an air gap 107*a* smaller than the large inter-wiring space is formed in the large inter-wiring space. As a result, air gaps in an upper layer and a lower layer can be prevented from being joined with each other, and the interface delamination can be suppressed.

—Formation of Air Gaps When Inter-Wiring Space is Large (3)—

When there is a wiring layer having an inter-wiring space which is larger than a smallest inter-wiring space of all wiring layers in a semiconductor device, air gaps (lines & spaces) (e.g., 107*b*) are preferably formed without forming air gaps 107, 117 corresponding to the large inter-wiring space in the large inter-wiring space.

This is because, as described in (1) and (2) above, there is a possibility that a portion of an air gap 107 is joined with a portion of an air gap trench 115 as shown in FIG. 8(*a*), and although the problem that the proportions of the air gaps 107 and 117 locally increase can be solved by the structure of (2) above, the structure of (2) has a large inter-wiring capacitance. Therefore, if air gaps (lines & spaces) 107*b* are formed in the large inter-wiring space as shown in FIG. 8(*c*), air gaps in an upper layer and a lower layer can be prevented from being joined with each other, and interface delamination can be suppressed, and moreover, an inter-wiring capacitance can be reduced.

—Formation of Air Gaps and Isolated Insulating Film (1)—

In an air gap trench, an isolated insulating film is preferably not formed. In other words, resist masks 104 and 114 having openings 104*a* and 114*a* which prevent an isolated insulating film from being formed in an air gap trench are preferably used.

Figure 9:
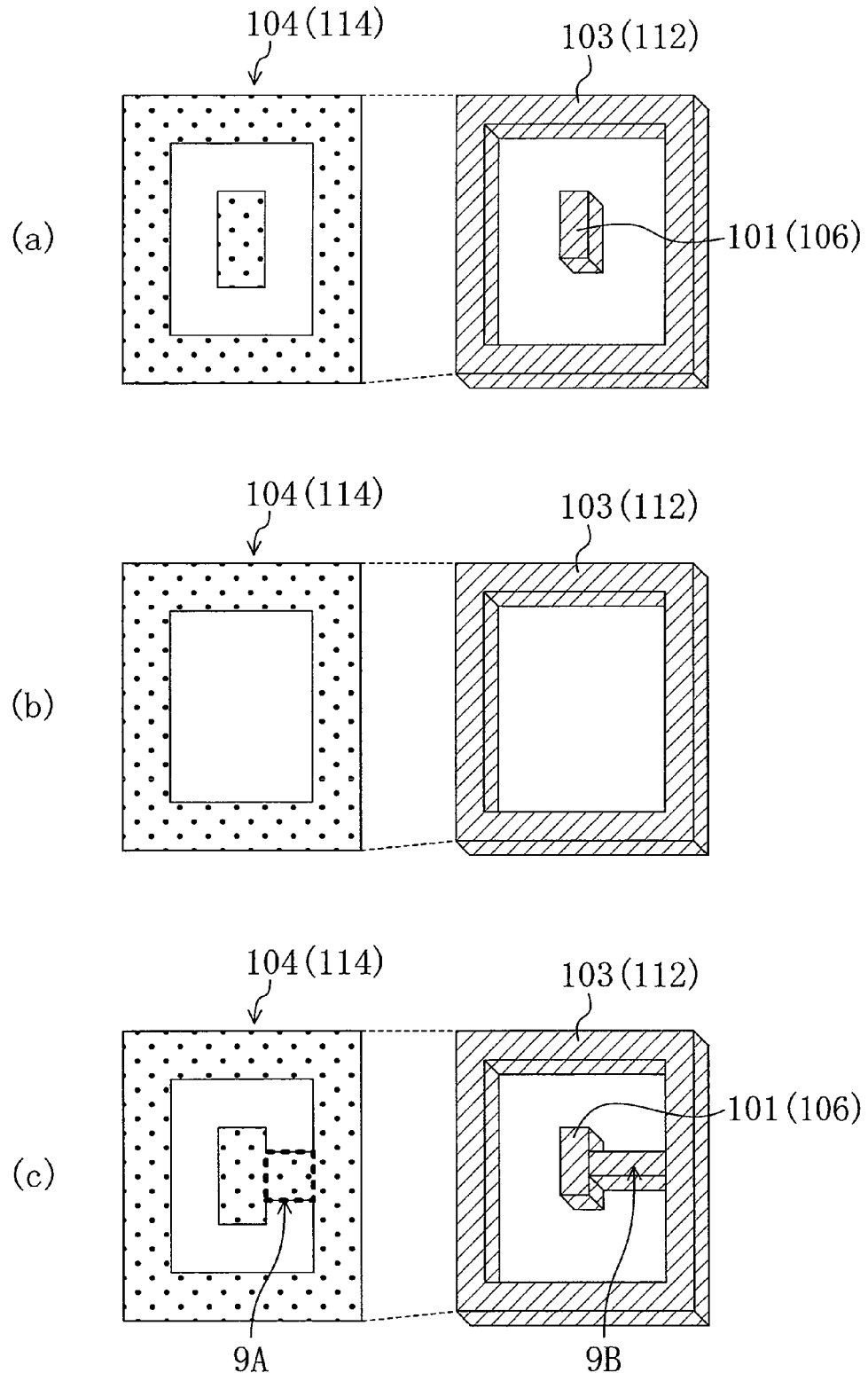
FIGS. 9(a) to 9(c) are diagrams for describing formation of an isolated insulating film and an air gap in the embodiment of the present invention.

This is because if, for example, as shown in FIG. 9(*a*), an isolated insulating film is formed in an air gap trench due to shapes of openings 104*a*, 114*a* of resist masks 104, 114, a bottom portion of the isolated insulating film has a small interface area, and therefore, a pattern of the insulating film falls, which causes occurrence of particles. Therefore, if resist masks 104 and 114 having openings 104*a* and 114*a* which prevent an isolated insulating film from being formed in an air gap trench are used to form the air gaps 107 and 117, the fall of the pattern of the insulating film portion can be suppressed.

—Formation of Air Gaps and Isolated Insulating Film (2)—

Even when an isolated insulating film is formed in an air gap trench, a structure for bridging between the insulating film, and a non-air gap trench-formed region, an adjacent wiring or another insulating film is preferably formed. In other words, resist masks 104 and 114 having openings 104*a* and 114*a* which allow the bridging structure to be formed in an air gap trench is preferably used.

This is because if an isolated insulating film is forbidden to be formed as described in (1) above, an air gap trench having a large area may be formed, for example, as shown in FIG. 9(*b*), likely leading to a reduction in mechanical strength and occurrence of interface delamination. Therefore, for example, as shown in FIG. 9(*c*), even when resist masks 104, 114 having openings 104*a*, 114*a* allow an isolated insulating film to be formed in air gap trenches, then if resist masks 104, 114 having openings 104*a*, 114*a* which allow a structure 9B bridging the isolated insulating film to be formed (resist masks 104, 114 having a bridging structure 9A) is used to form air gaps 107, 117, a sufficient mechanical strength can be obtained and the interface delamination can be suppressed while suppressing the fall of the pattern of the insulating film portion. Note that if a length between wirings of an air gap trench is no less than five times as large as a smallest inter-wiring space, an edge portion of an insulating film supporting a wiring has a large surface roughness, and therefore, there is a possibility that the wiring falls and is lost. In view of this, the bridging structures 9A, 9B are preferably formed at at least one place.

—Formation of Air Gaps and Isolated Wirings (1)—

In air gap trenches, isolated wirings 103 and 112 are preferably not formed. In other words, resist masks 104 and 114 having openings 104*a* and 114*a* which prevent isolated wirings 103 and 112 from being formed in air gap trenches are preferably used.

Figure 10:
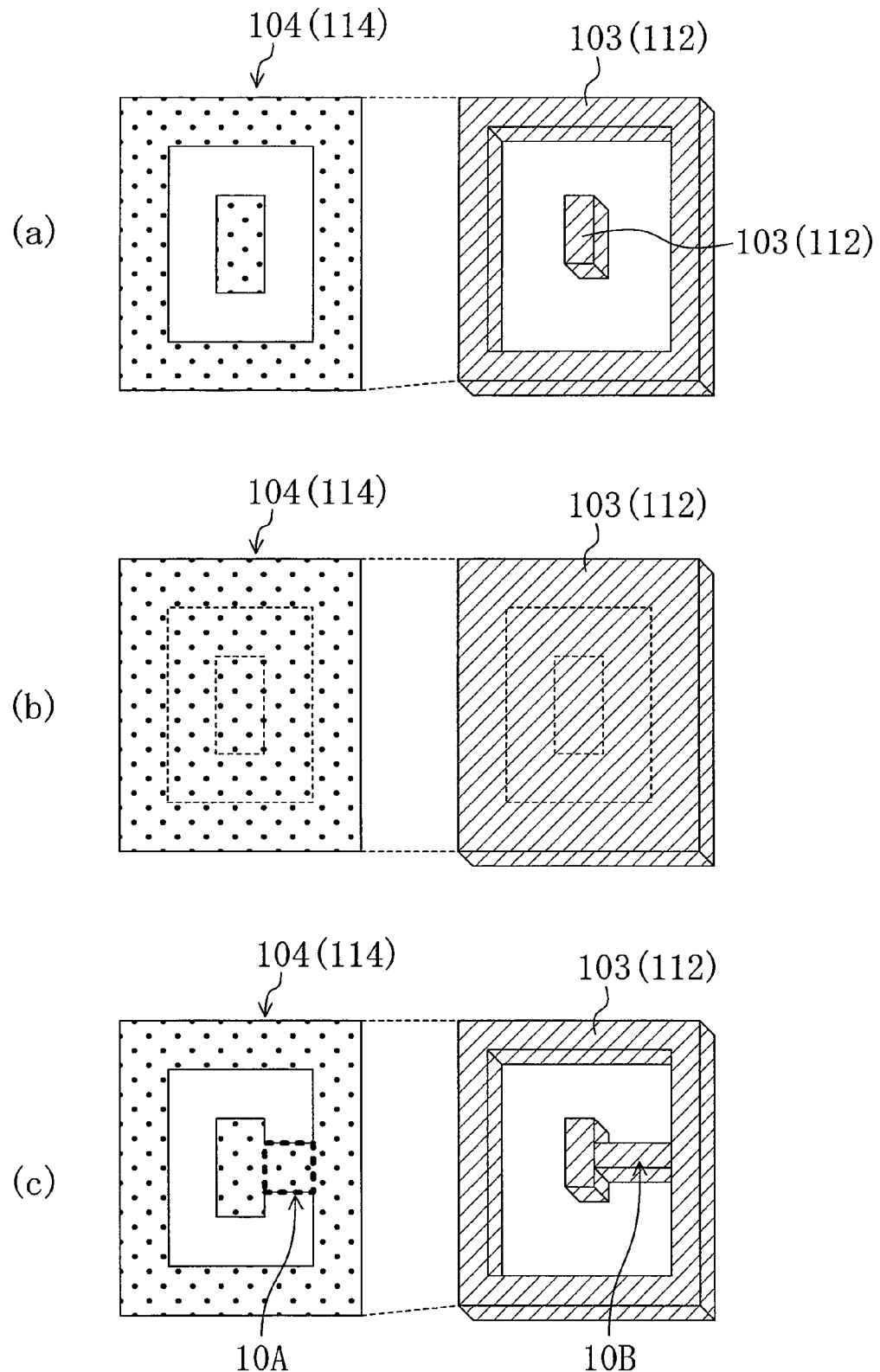
FIGS. 10(a) to 10(c) are diagrams for describing formation of an isolated insulating film and an air gap in the embodiment of the present invention.

This is because if, for example, as shown in FIG. 10(*a*), isolated wirings 103, 112 are formed in air gap trenches due to shapes of openings 104*a*, 114*a* of resist masks 104, 114, since bottom portions of the isolated wirings 103, 112 have a small interface area, the patterns of the wirings 103, 112 fall, which causes occurrence of a failure to open the wiring. Therefore, by forming the air gaps 107 and 117 using resist masks 104 and 114 having openings 104*a* and 114*a* which prevent isolated wirings 103 and 112 from being formed in air gap trenches, the failure to open wirings due to the fall of the wiring pattern can be suppressed.

—Formation of Air Gaps and Isolated Wirings (2)—

Even when an isolated wiring is formed in an air gap trench, a structure for bridging between the wiring and a non-air gap trench-formed region, an adjacent wiring or an insulating film is preferably formed. In other words, resist masks 104 and 114 having openings 104*a* and 114*a* which allow the bridging structure to be formed in a air gap trench is preferably used.

This is because if an isolated wiring is forbidden to be formed as described in (1) above, wirings 103, 112 having a large area are formed and therefore an inter-wiring capacitance increases, for example, as shown in FIG. 10(*b*), so that a wiring delay occurs. Therefore, even if resist masks 104, 114 having openings 104*a*, 114*a* which allow isolated wirings 103, 112 to be formed in air gap trenches, for example, as shown in FIG. 10(*c*), then when air gaps 107, 117 are formed using resist masks 104, 114 having openings 104*a*, 114*a* which allow a bridging structure 10B bridging the isolated wirings 103, 112 to be formed (resist masks 104, 114 having a bridging structure 10A), the wiring delay due to an increase in inter-wiring capacitance can be suppressed while suppressing the failure to open the wiring due to the fall of the wiring pattern. Note that when a length between wirings of an air gap trench is no less than five times as large as a smallest inter-wiring space, an edge portion of an insulating film supporting a wiring has high surface roughness, and therefore, there is a possibility that the wiring falls and is lost. In view of this, the bridging structures 10A, 10B are preferably formed at at least one place.

—Formation of Air Gaps in Regions Below Pads—

In regions below bonding pads for carrying out wire bonding which are formed in an uppermost layer of a semiconductor device, the air gaps 107 and 117 are preferably not formed.

Figure 11:
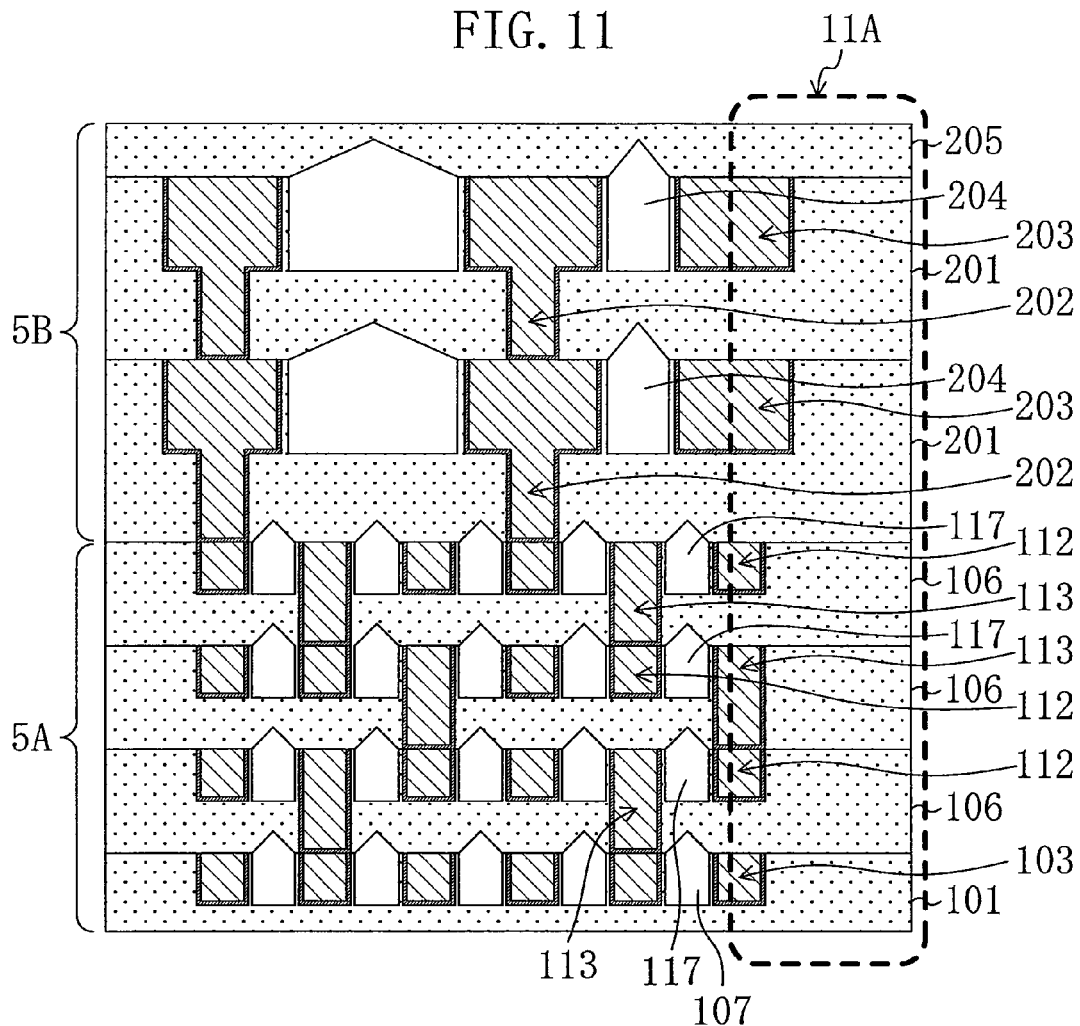
FIG. 11 is a diagram for describing formation of air gaps in regions below pads in the embodiment of the present invention.

This is because if air gaps 107, 117 are formed in a lower region of a bonding pad in an uppermost layer of a semiconductor device, this region has a smaller mechanical strength than that of an insulating film structure in which air gaps 107, 117 are not formed, and therefore, there is a possibility that a wiring layer collapses. Therefore, by providing resist masks 104 and 114 having openings 104a and 114a which prevent formation of air gaps 107 and 117 in lower regions of bonding pads, for example, as shown in FIG. 11, a sufficient mechanical strength can be held and therefore a semiconductor device in which wire bonding can be performed can be achieved.

—Formation of Air Gaps in Region in which Bonding Pads are Provided—

When bonding pads for carrying out wire bonding which are formed in an uppermost layer of a semiconductor device are formed in active regions in an entire surface of a chip, the multilayer average area ratio of air gaps 107 and 117 in desired test regions of all layers to which the air gaps 107 and 117 are provided at coordinate points at which bonding pads are provided, is preferably 15% or less. Note that the area ratio in this case is preferably calculated for each region in the shape of, for example, a square with sides of 20 μm.

Figure 12:
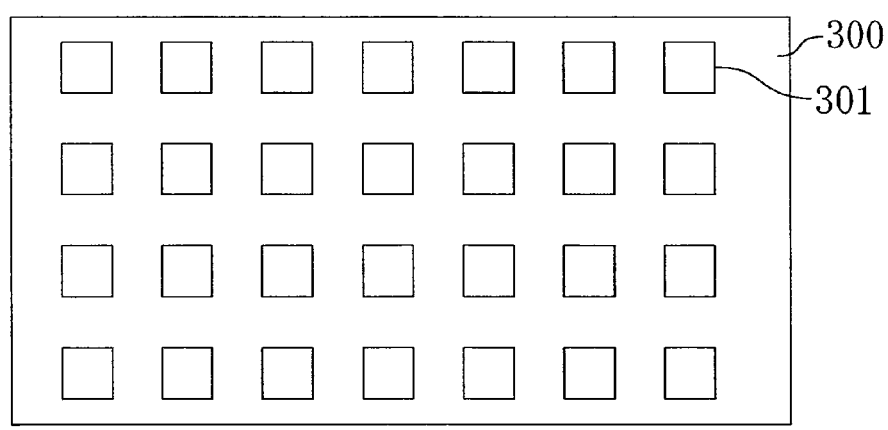
FIG. 12 is a diagram for describing regions where bonding pads are provided and formation of air gaps in the embodiment of the present invention.

This is because if, for example, as shown in FIG. 12, bonding pads 301 in an uppermost layer of a semiconductor device are formed in active regions of an entire surface of a chip 300, and wire bonding is carried out, then if the multilayer average area ratio of air gaps 107 and 117 in regions below the bonding pads 301 is large, a mechanical strength is lower than that of an insulating film structure in which the air gaps 107 and 117 are not formed, and therefore, there is a possibility that a wiring layer collapses. Therefore, by providing resist masks 104 and 114 having opening 104a and 114a which allow the multilayer average area ratio of the air gaps 107 and 117 to be 15% or less with respect to all layers to which the air gaps 107 and 117 are provided at coordinate points at which bonding pads are provided, a sufficient mechanical strength can be held and therefore a semiconductor device which allows wire bonding can be achieved.

—Formation of Air Gaps in Regions at Corner Portions of Chip—

In a corner portion of a chip, the air gaps 107 and 117 are preferably not formed. Note that the chip corner portion in this case refers to, for example, a region in the shape of a square with sides of 20 μm.

Figure 13:
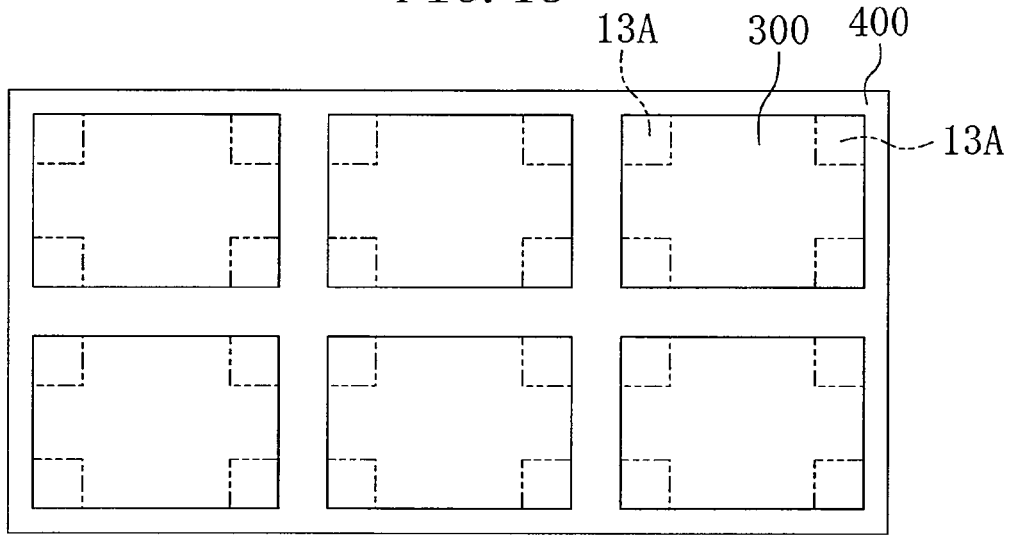
FIG. 13 is a diagram for describing formation of air gaps in regions at corner portions of chips in the embodiment of the present invention.

This is because if, for example, as shown in FIG. 13, the air gaps 107 and 117 are formed in corner portions 13A of each chip 300 on a semiconductor wafer 400, a mechanical strength at the corner portion 13A of the chip 300 is reduced, and therefore, when the chip 300 is cut out from the semiconductor wafer 400 (hereinafter referred to as dicing), there is a possibility that a crack occurs from an outer perimeter to an inside of the chip 300. Therefore, by using resist masks 104 and 114 having openings 104a and 114a which prevent the air gaps 107 and 117 from being formed in the corner portions 13A of the chip 300, a sufficient mechanical strength can be obtained at the corner portion 13A of the chip 300, thereby making it possible to suppress the occurrence of a crack in the corner portion 13A of the chip 300 during dicing. Moreover, although the region of the chip corner portion 13A is here assumed to be in the shape of, for example, a square with sides of 20 μm, this length is, for example, set to be the same as a distance from an edge portion of a sealing formed in a peripheral portion of the chip 300 to a boundary surface of a chip after dicing, and the present invention is not limited to this. The length of the side of the square of the corner portion 13A can be set to other values so as to be the same as the distance.

—Formation of Air Gaps in Peripheral Regions of Wirings Connected to Diffusion Layer—

The air gaps 107 and 117 are preferably formed only around wirings connected to a diffusion layer.

This is because when multilayer wirings are formed, a wiring may not be connected to the diffusion layer, and in this case, if an air gap is formed around such a wiring, a mechanical strength of the whole semiconductor device is significantly reduced. Therefore, in order to prevent such a reduction in mechanical strength, resist masks 104 and 114 having openings 104a and 114a which allow the air gaps 107 and 117 to be formed only around wirings connected to the diffusion layer, thereby making it possible to obtain a sufficient mechanical strength of the whole semiconductor device.

—Formation of Air Gaps in IO Portions—

The air gaps 107 and 117 are preferably formed in at least circuits excluding IO portions.

This is because the IO portions of a semiconductor device include a portion which needs to withstand a high voltage and does not need to perform high-speed transmission, and if the air gaps 107 and 117 are formed in the IO portions, a mechanical strength of the semiconductor device is significantly reduced. Therefore, by using resist masks 104 and 114 having openings 104a and 114a which prevent the air gaps 107 and 117 from being formed in at least circuits excluding the IO portions, a sufficient mechanical strength of the semiconductor device can be obtained.

—Formation of Air Gaps, and Memory Portion—

The air gaps 107 and 117 are preferably formed in a memory portion (DRAM, etc.) of a semiconductor device.

This is because word and bit lines need to perform high-speed transmission in a memory portion (DRAM, etc.) of a semiconductor device. Therefore, by using resist masks 104 and 114 having openings 104a and 114a which allow the air gaps 107 and 117 to be formed in such a portion which needs to perform high-speed transmission, an inter-wiring capacitance can be reduced at such a portion, resulting in high-speed transmission.

—Formation of Air Gaps in Capacitor Portion—

The air gaps 107 and 117 are preferably prevented from being formed in a capacitor region.

This is because if the air gaps 107 and 117 are formed in a capacitor region of a semiconductor device, an inter-wiring capacitance is reduced, and therefore, a chip area needs to be increased so as to achieve a predetermined inter-wiring capacitance. Therefore, by using resist masks 104 and 114 having openings 104a and 114a which prevent the air gaps 107 and 117 from being formed in a capacitor region, the area of the capacitor region can be reduced.

—Formation of Air Gaps in CCD Photodetector Portion—

Formation of air gaps is preferably controlled around a photodetector portion of a CCD. In this case, air gaps are preferably not formed in the photodetector portion or in a 5-μm range of its peripheral circuit portion.

Figure 14:
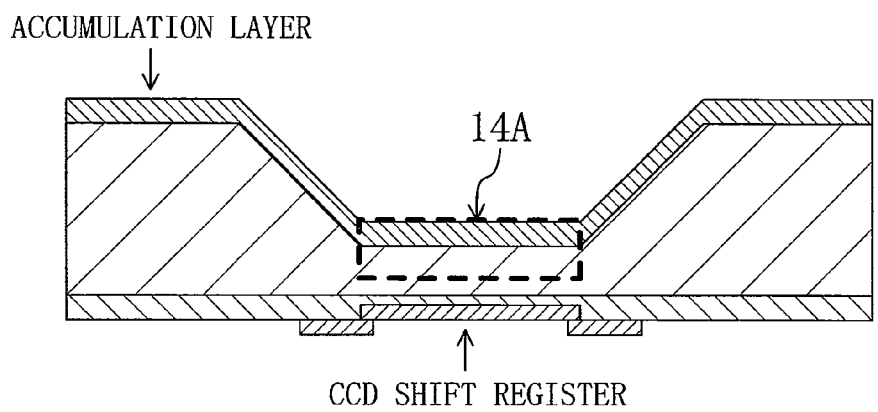
FIG. 14 is a diagram for describing formation of air gaps in a CCD photodetector portion in the embodiment of the present invention.

This is because if, for example, as shown in a cross-sectional view of a photodetector portion of a CCD of FIG. 14, the air gaps 107 and 117 are formed in a photodetector portion 14A, then a reduction in inter-wiring capacitance enables a peripheral circuit to perform high-speed transmission, however, the index of refraction of the photodetector portion 14A is altered, so that the photodetector portion 14A no longer functions as a photodetector. Therefore, by using resist masks 104 and 114 having openings 104a and 114a which prevent the air gaps 107 and 117 from being formed around the photodetector portion 14A of the CCD, the index of refraction of the photodetector portion 14A can be controlled, the operation of the photodetector portion 14A as a photodetector can be ensured, and the high-speed operation of a peripheral circuit can be achieved.

—Formation of Air Gaps in Wiring Fuse Portion—

The air gaps 107 and 117 are preferably not formed in a wiring fuse portion.

Figure 15:
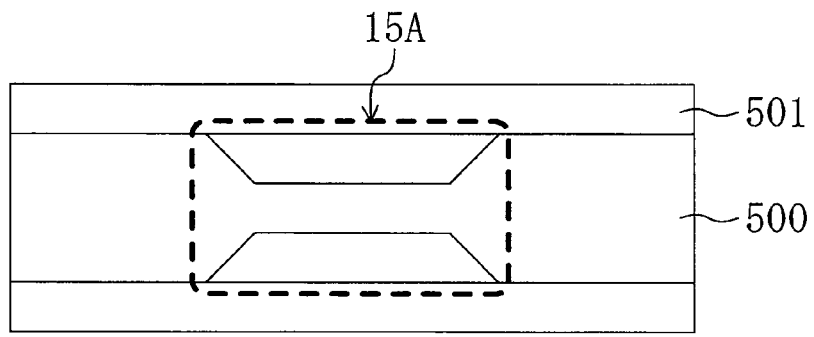
FIG. 15 is a diagram for describing formation of air gaps in a wiring fuse portion in the embodiment of the present invention.

This is because a fuse employing a wiring may be formed in a semiconductor device, and when the fuse is cut, laser is used or a large current is instantaneously passed, and in either case, an insulating film around the wiring is damaged (a crack, etc.). Therefore, by using resist masks 104 and 114 having openings 104a and 114a which prevent the air gaps 107 and 117 from being formed in a region 15A around a fuse portion of a wiring fuse 500, for example, as shown in FIG. 15, an inter-wiring insulating film 501 can be prevented from being damaged during cutting of the fuse.

—Formation of Air Gaps in Regions Immediately above Via Holes—

The air gaps 107 and 117 are preferably not formed in regions immediately above via holes.

Figure 16:
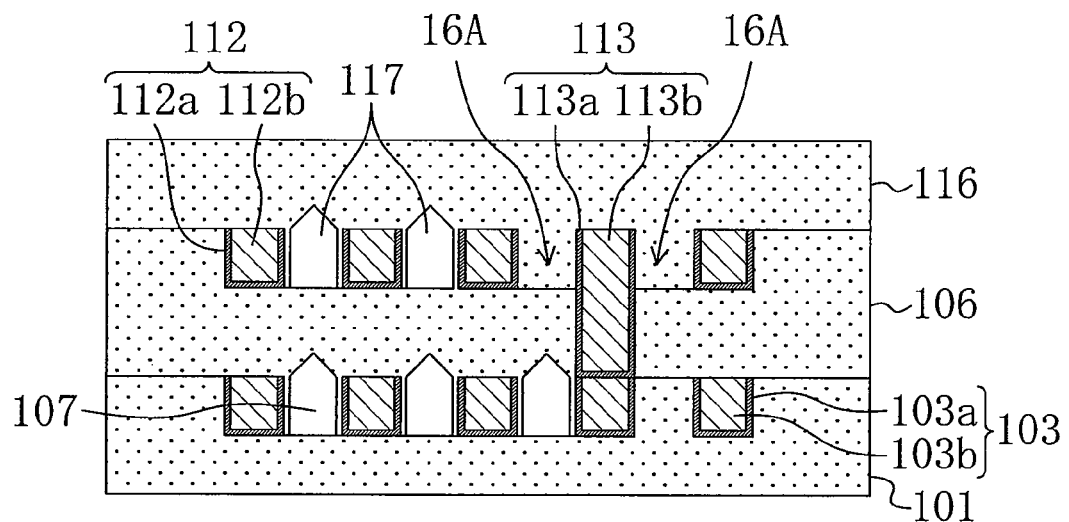
FIG. 16 is a diagram for describing formation of air gaps in a region immediately above a via hole in the embodiment of the present invention.

This is because when a lower-layer wiring and an upper-layer wiring are joined with each other, a via hole is formed, however, if the air gaps 107 and 117 are formed around the wiring immediately above the via hole, the mobility of Cu atoms in the upper-layer wiring increases in the presence of applied current or the like, leading to a decrease in reliability of the upper-layer wiring. Therefore, by using resist masks 104 and 114 having openings 104a and 114a which prevent the air gaps 107 and 117 from being formed in an upper portion of the via hole 113 (a region 16A around a region connected to the wiring 112), for example, as shown in FIG. 16, the mobility of Cu atoms in the upper-layer wiring can be suppressed, thereby making it possible to improve the reliability.

—Formation of Air Gaps in Region Where Inter-Wiring Spaces Meet from Three or More Directions—

The air gaps 107 and 117 are preferably not formed in a region where inter-wiring spaces meet from three or more directions.

Figure 17:
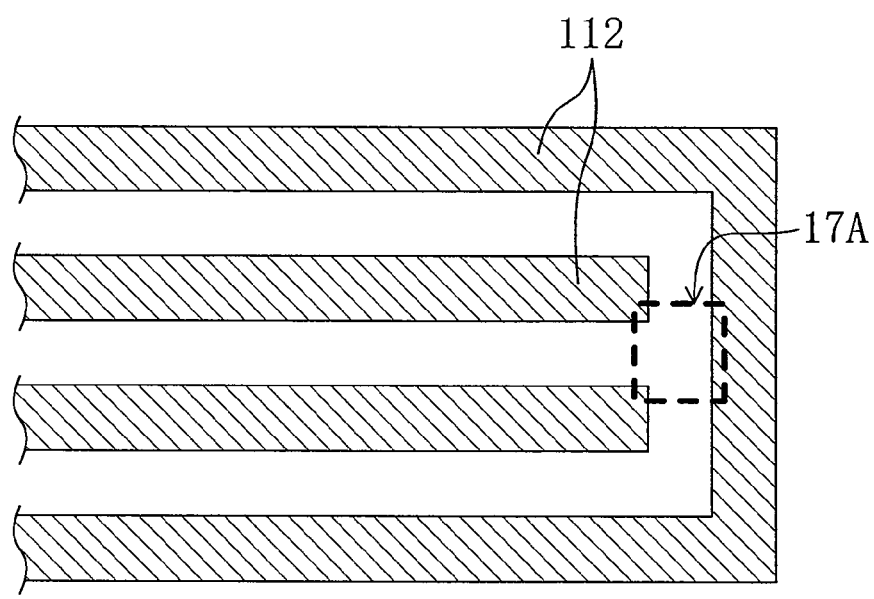
FIG. 17 is a diagram for describing formation of an air gap in a region where inter-wiring spaces meet from three or more directions in the embodiment of the present invention.
Figure 18:
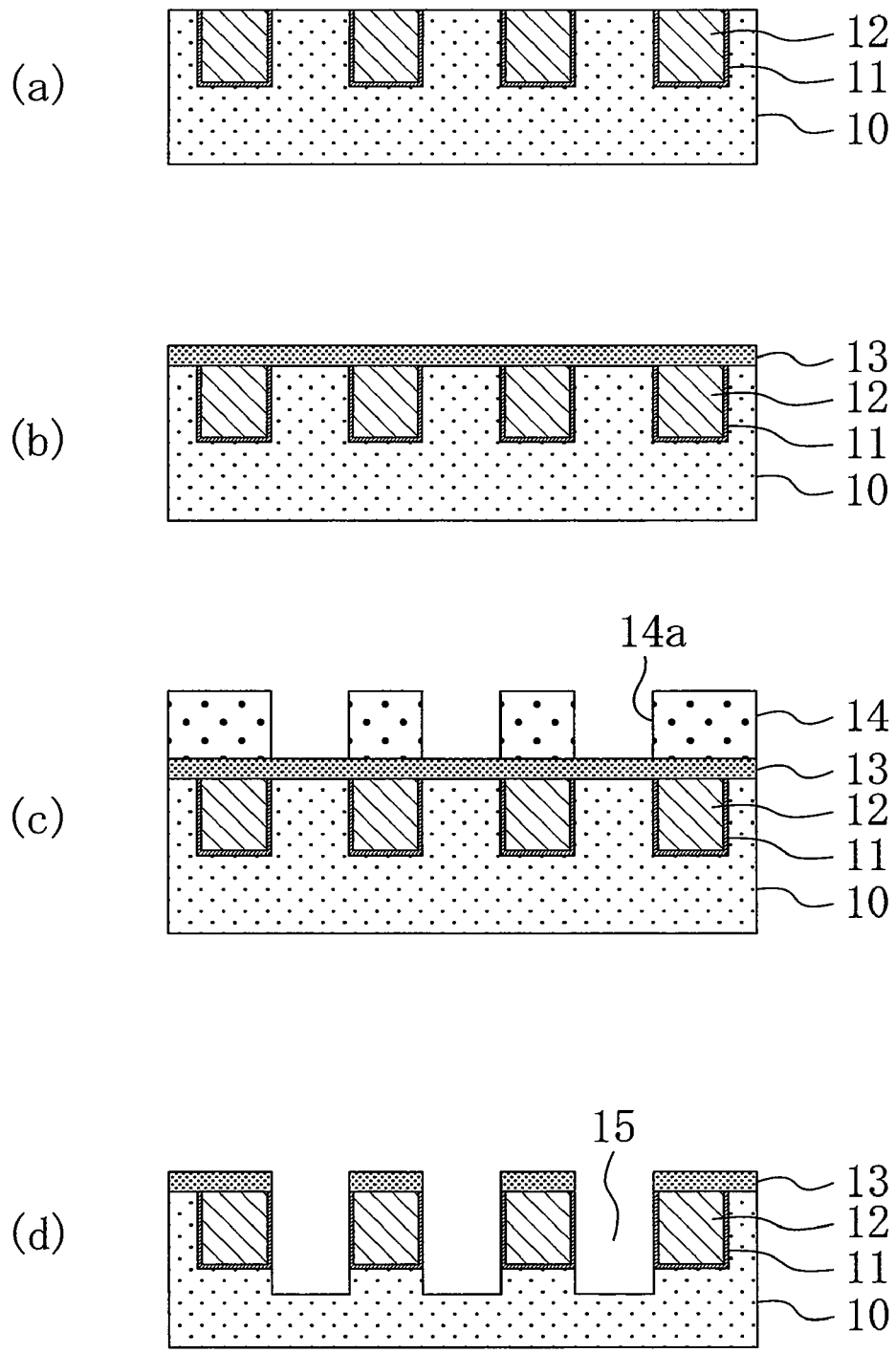
FIGS. 18(a) to 18(d) are cross-sectional views showing a conventional method for fabricating a semiconductor device in order in which the device is fabricated.
Figure 19:
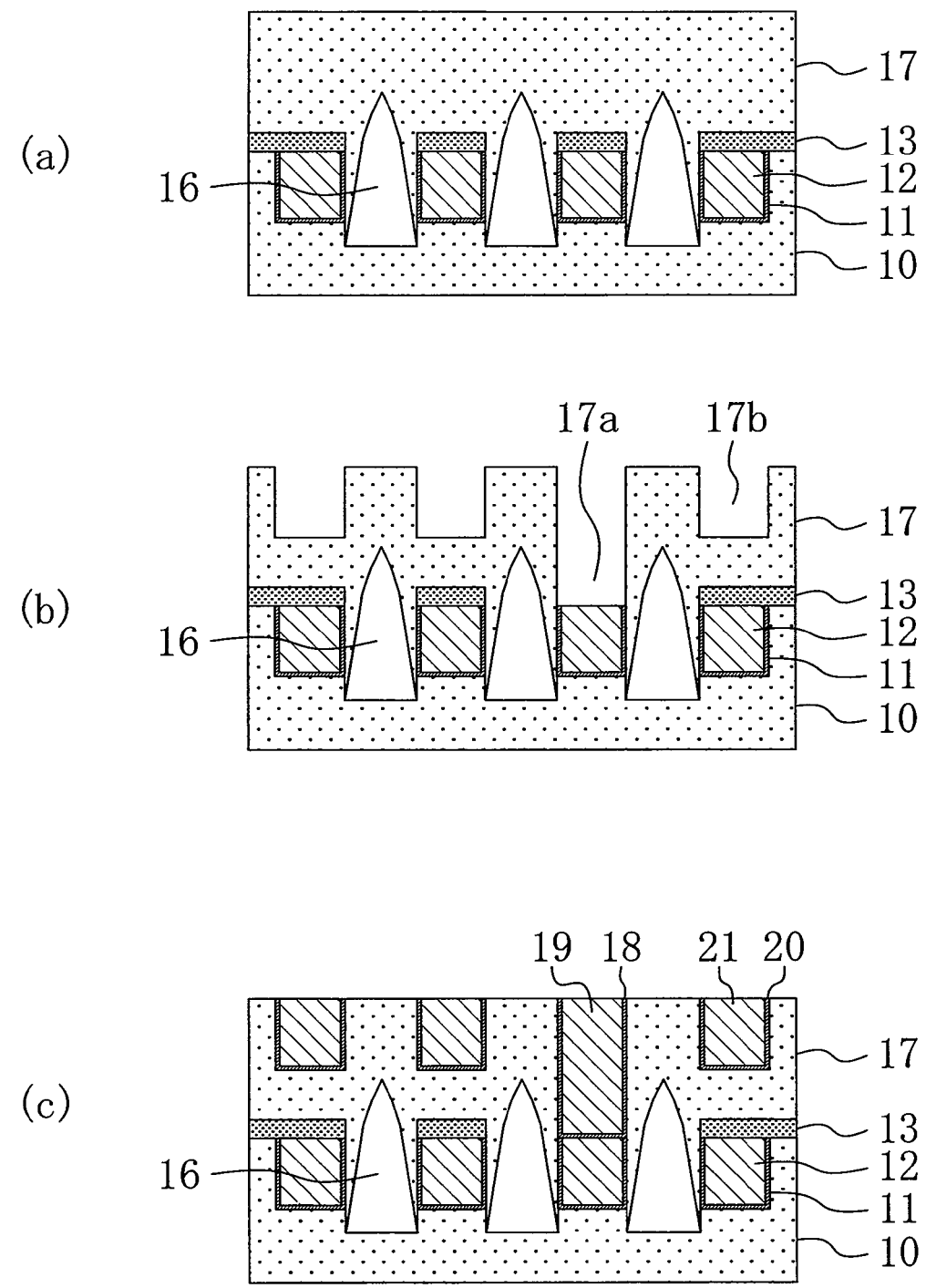
FIGS. 19(a) to 19(c) are cross-sectional views showing the conventional semiconductor device fabricating method in order in which the device is fabricated.

This is because if, for example, as shown in FIG. 17, the air gaps 107 and 117 are formed in a region 17A where spaces between wirings 112 meet from three or more directions, the air gaps 107 and 117 in the region 17A have a height larger than that of the air gaps 107 and 117 formed in a region where spaces between the wirings 112 meet from two directions, and therefore, the heights of the air gaps 107 and 117 are not uniform. Therefore, by using resist masks 104 and 114 having openings 104a and 114a which prevent the air gaps 107 and 117 from being formed in a region where spaces between the wirings 112 meet from three or more directions, the heights of the air gaps 107 and 117 in a wiring layer can be caused to be uniform.

—Formation of Air Gaps in Analog Circuit Portion—

The air gaps 107 and 117 are preferably not formed in an analog circuit portion.

This is because if the air gaps 107 and 117 are formed in an analog circuit portion, signal timing becomes anomalous, so that the circuit is likely to fail to operate. Therefore, by using resist masks 104 and 114 having openings 104a and 114a which prevent the air gaps 107 and 117 from being formed in an analog circuit portion, it is possible to prevent the analog circuit portion from operating anomalously.

INDUSTRIAL APPLICABILITY

The present invention is useful for a semiconductor device having a multilayer wiring structure in which an air gap is provided between wirings, and a fabrication method thereof.

The invention claimed is:

1. A method for fabricating a semiconductor device including a multilayer wiring structure including a plurality of wiring layers having an air gap between wirings, the method comprising the steps of:
   forming an insulating film on a semiconductor substrate;
   forming a plurality of wiring trenches in the insulating film;
   forming a plurality of the wirings in the plurality of wiring trenches;
   forming a resist mask having an opening for selectively exposing one of regions between the plurality of wirings, on the insulating film and the plurality of wirings;
   forming an air gap trench by removing the insulating film from the selectively exposed one of the regions between the plurality of wirings by etching using the resist mask; and
   forming the air gap in the air gap trench by depositing an inter-layer insulating film over the plurality of wirings after removal of the resist mask, wherein
   the air gap is formed only in at least one wiring layer having a relatively thin film thickness of the plurality of wiring layers.

2. A method for fabricating a semiconductor device including a multilayer wiring structure including a plurality of wiring layers having an air gap between wirings, the method comprising the steps of:
   forming an insulating film on a semiconductor substrate;
   forming a plurality of wiring trenches in the insulating film;
   forming a plurality of the wirings in the plurality of wiring trenches;
   forming a resist mask having an opening for selectively exposing one of regions between the plurality of wirings, on the insulating film and the plurality of wirings;
   forming an air gap trench by removing the insulating film from the selectively exposed one of the regions between the plurality of wirings by etching using the resist mask; and
   forming the air gap in the air gap trench by depositing an inter-layer insulating film over the plurality of wirings after removal of the resist mask, wherein
   the opening of the resist mask is formed based on a proportion of an area of the opening in a desired region of a single one of the wiring layers.

3. The semiconductor device fabricating method of claim 1, wherein the opening of the resist mask is formed based on an average of proportions of areas of the openings in desired regions of respective wiring layers in which the air gap is formed of the plurality of wiring layers.

4. The semiconductor device fabricating method of claim 1, wherein when the plurality of wirings in the wiring layer include a wiring used as a signal line and a dummy wiring, the opening of the resist mask is formed in a manner which prevents a region in which the dummy wiring is formed and which is located at a distance of 1 ?m or more from the wiring used as a signal line, from being exposed.

5. The semiconductor device fabricating method of claim 1, wherein in a structure in which the wiring layer as an upper layer is formed on the wiring layer as a lower layer in which the air gap is formed, the opening of the resist for use in forming the upper wiring layer is formed in a manner which prevents a region immediately above the air gap of the lower wiring layer, from being exposed.

6. The semiconductor device fabricating method of claim 1, wherein
the plurality of the wirings have a first inter-wiring space, and a second inter-wiring space which is larger than the first inter-wiring space, and
in a structure in which the wiring layer as an upper layer is formed on the wiring layer as a lower layer having the second inter-wiring space, the opening of the resist for use in forming the upper wiring layer is formed in a manner which prevents a region immediately above the air gap having a width corresponding to the second inter-wiring space, the air gap being formed in the lower wiring layer, from being exposed.

7. The semiconductor device fabricating method of claim 1, wherein
the plurality of the wirings have a first inter-wiring space, and a second inter-wiring space which is larger than the first inter-wiring space, and
in a structure in which the wiring layer as an upper layer is formed on the wiring layer as a lower layer having the second inter-wiring space, the opening of the resist for use in forming the lower wiring layer is formed in a manner which allows a region narrower than the second inter-wiring space to be exposed.

8. The semiconductor device fabricating method of claim 1, wherein
the plurality of the wirings have a first inter-wiring space, and a second inter-wiring space which is larger than the first inter-wiring space, and
in a structure in which the wiring layer as an upper layer is formed on the wiring layer as a lower layer having the second inter-wiring space, the opening of the resist for use in forming the lower wiring layer is formed in a manner which allows the first inter-wiring space to be periodically exposed.

9. The semiconductor device fabricating method of claim 1, wherein in the forming the air gap trench, the opening of the resist mask is formed in a manner which prevents a portion forming the insulating film to be isolated in the air gap trench.

10. The semiconductor device fabricating method of claim 1, wherein in the forming the air gap trench, the opening of the resist mask is formed in a manner which provides a first portion forming the insulating film isolated in the air gap trench and a second portion where the first portion is joined with a region in which the air gap is not formed.

11. The semiconductor device fabricating method of claim 10, wherein in the forming the air gap trench, when a length between the wirings of the formed air gap trench is five times or more as large as a smallest inter-wiring space between the wirings, the joined portion is formed at least one place.

12. The semiconductor device fabricating method of claim 1, wherein in the forming the air gap trench, the opening of the resist mask is formed in a manner which prevents a portion forming the wiring from being isolated in the air gap trench.

13. The semiconductor device fabricating method of claim 1, wherein in the forming the air gap trench, the opening of the resist mask is formed in a manner which provides a first portion forming the wiring formed and isolated in the air gap trench, and a second portion where the first portion is joined with a region where the air gap is not formed.

14. The semiconductor device fabricating method of claim 13, wherein in the forming the air gap trench, when a length between the wirings of the formed air gap trench is five times or more as large as a smallest inter-wiring space between the wirings, the joined portion is formed at least one place.

15. The semiconductor device fabricating method of claim 1, wherein the opening of the resist mask is formed in a manner which prevents a region immediately below a region where a bonding pad is provided, from being exposed.

16. A method for fabricating a semiconductor device including a multilayer wiring structure including a plurality of wiring layers having an air gap between wirings, the method comprising the steps of:
forming an insulating film on a semiconductor substrate;
forming a plurality of wiring trenches in the insulating film;
forming a plurality of the wirings in the plurality of wiring trenches;
forming a resist mask having an opening for selectively exposing one of regions between the plurality of wirings, on the insulating film and the plurality of wirings;
forming an air gap trench by removing the insulating film from the selectively exposed one of the regions between the plurality of wirings by etching using the resist mask; and
forming the air gap in the air gap trench by depositing an inter-layer insulating film over the plurality of wirings after removal of the resist mask, wherein
the opening of the resist mask is formed based on an average of proportions of areas of the openings in desired regions of respective wiring layers in which the air gap is formed of the plurality of wiring layers, in a region of an active region immediately below a region where a bonding pad is provided.

17. The semiconductor device fabricating method of claim 1, wherein the opening of the resist mask is formed in a manner which prevents a region with sides of 20 ?m at a corner portion of a chip, from being exposed.

18. The semiconductor device fabricating method of claim 1, wherein when a via hole is provided between two of the plurality of wiring layers, the via hole connecting a wiring in the upper one of the two wiring layers and a wiring in the lower one of the two wiring layers, the opening of the resist mask is formed in a manner which prevents a region around the wiring in the upper wiring layer connected to the via hole, from being exposed.

19. The semiconductor device fabricating method of claim 1, wherein the opening of the resist mask is formed in a manner which prevents a region where spaces between the wirings meet from three or more directions, from being exposed.

20. The semiconductor device fabricating method of claim 2, wherein the proportion of the area of the opening in the desired region of the single one of the wiring layers is less than or equal to 30%.

21. The semiconductor device fabricating method of claim 3, wherein the proportion of the area of the opening in the desired region of the single one of the wiring layers is less than or equal to 25%.

* * * * *